(12) United States Patent
Kanamori et al.

(10) Patent No.: US 6,492,223 B2
(45) Date of Patent: Dec. 10, 2002

(54) METHOD OF FABRICATING SEMICONDUCTOR DEVICE EQUIPPED WITH CAPACITOR PORTION

(75) Inventors: Jun Kanamori, Tokyo (JP); Yoshiaki Katakura, Kanagawa (JP)

(73) Assignee: Oki Electric Industry Co, Ltd., Tokyo (JP)

(*) Notice: Subject to any disclaimer, the term of this patent is extended or adjusted under 35 U.S.C. 154(b) by 0 days.

(21) Appl. No.: 09/848,235

(22) Filed: May 4, 2001

(65) Prior Publication Data

US 2002/0006700 A1 Jan. 17, 2002

(30) Foreign Application Priority Data

Jun. 9, 2000 (JP) .................................. 2000-174124
Dec. 7, 2000 (JP) .................................. 2000-372407

(51) Int. Cl.[7] .......................................... H01L 21/8242
(52) U.S. Cl. .................... 438/240; 438/253; 438/669
(58) Field of Search .............................. 438/240, 253, 438/254, 396, 397, 669, 671

(56) References Cited

U.S. PATENT DOCUMENTS

| 5,920,775 A | * | 7/1999 | Koh | 438/253 |
| 6,100,155 A | * | 8/2000 | Hu | 438/253 |
| 6,124,199 A | * | 9/2000 | Gambino et al. | 438/253 |
| 6,258,654 B1 | * | 7/2001 | Gocho | 438/240 |

* cited by examiner

Primary Examiner—Chandra Chaudhari
(74) Attorney, Agent, or Firm—Rabin & Berdo, P.C.

(57) ABSTRACT

In fabricating a capacitor portion of a semiconductor device, after forming an upper electrode, a resist pattern for forming a lower electrode is formed and etching processing of an insulating film layer and a first metal layer is carried out. Thus, the lower electrode and a wiring pattern can simultaneously be formed by etching the insulating film layer and the first metal layer after forming a resist pattern one time, without a resist pattern directly formed on the first metal layer.

20 Claims, 8 Drawing Sheets

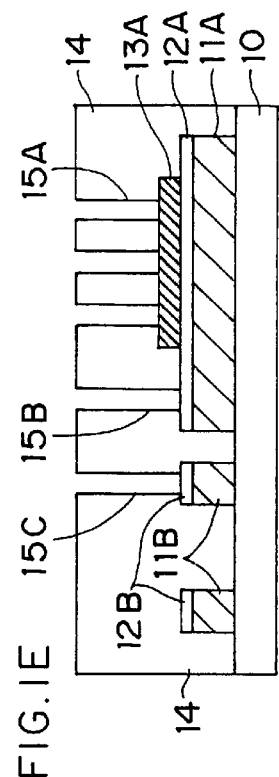
FIG.1A
FIG.1B
FIG.1C
FIG.1D
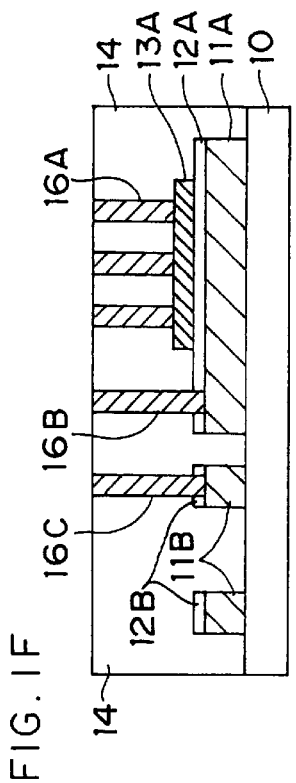
FIG.1E
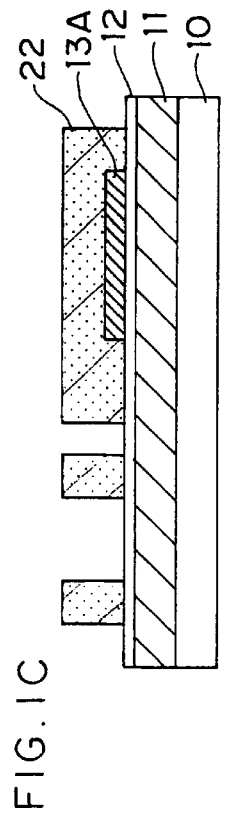
FIG.1F
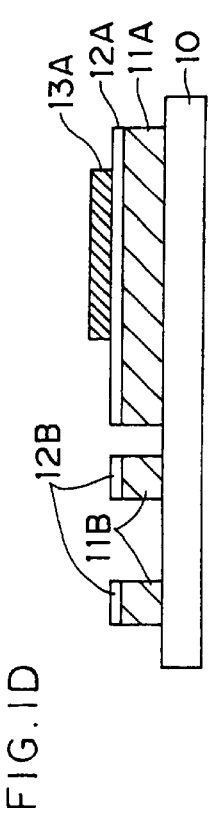
FIG.1G

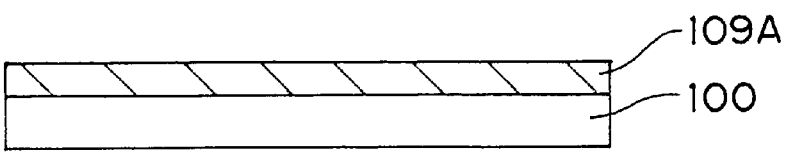
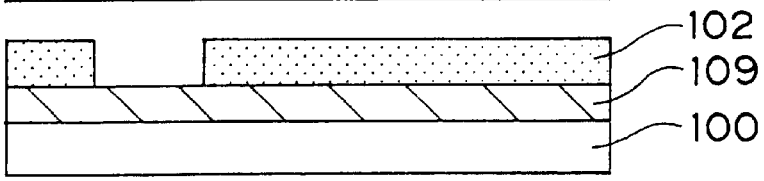
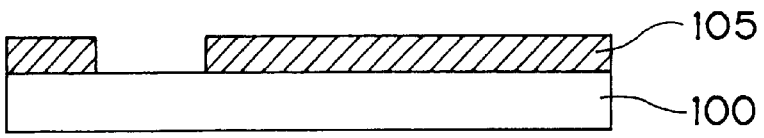
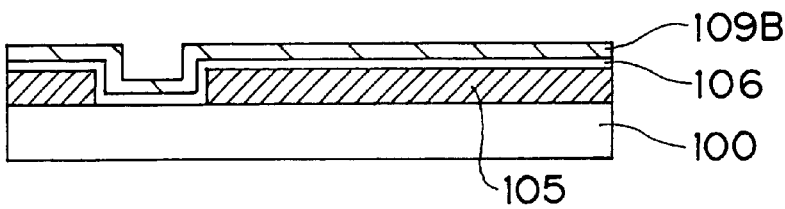
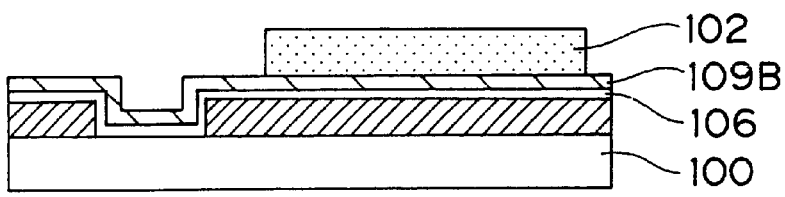
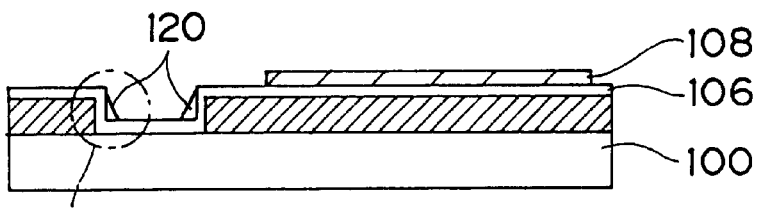
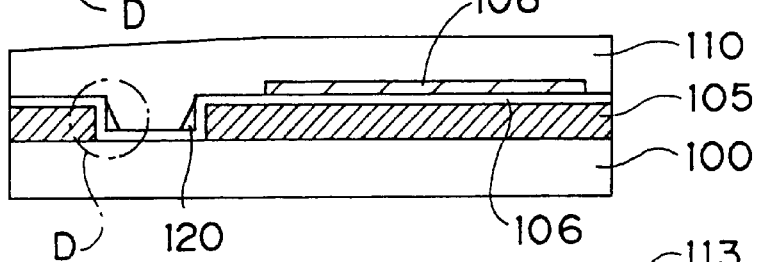
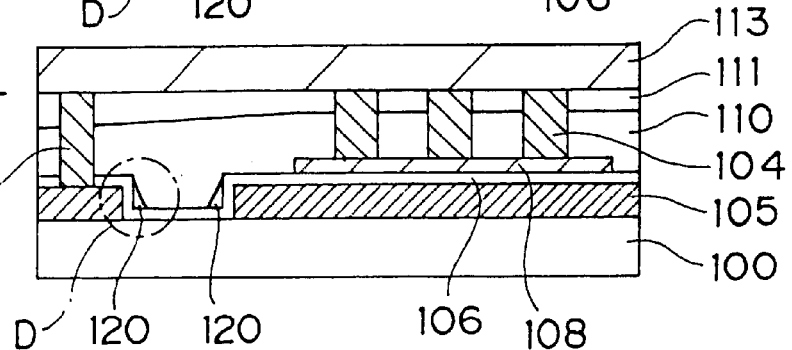

METHOD OF FABRICATING SEMICONDUCTOR DEVICE EQUIPPED WITH CAPACITOR PORTION

BACKGROUND OF THE INVENTION

1. Field of the Invention

The present invention relates to a method of fabricating a semiconductor device which is equipped with a capacitor portion, and in particular, to a method of fabricating a semiconductor device, such as a semiconductor integrated circuit or the like, which is equipped with a capacitor portion.

2. Description of the Related Art

In semiconductor devices, and in analog circuits and RF (radio frequency) circuits in particular, a capacitor portion is an indispensable element. Conventionally, semiconductor devices, such as semiconductor integrated circuits, equipped with a capacitor portion have been structured as follows.

As illustrated in FIG. 8, underlayer wiring patterns 101A, 101B are formed on a semiconductor substrate 100. An insulating film layer 103 is formed on the underlayer wiring patterns 101A, 101B. At the insulating film layer 103 are formed a lower electrode 105, which is one electrode of a capacitor portion, and vias 104A, 104B for connecting a wire 107B for leading an electrode and the like. The lower electrode 105 is provided above (i.e., at the upper side of in FIG. 8) the vias 104A. The lower electrode 105 is connected to the vias 104A and the underlayer wiring pattern 101A, and to the wire 107B for leading an electrode via the via 104B. Moreover, a capacitor insulating film pattern 106 is formed so as to cover the lower electrode 105. An upper electrode 108 is provided on the capacitor insulating film pattern 106.

Such a conventional semiconductor device equipped with a capacitor portion is fabricated as follows.

First, an underlayer wiring layer is formed on the semiconductor substrate 100. The underlayer wiring patterns 108, 101B are formed by photolithography and etching processing. Next, the insulating film layer 103 is deposited on the underlayer wiring patterns 101A, to 101B. Thereafter, openings are formed in the insulating film layer 103. Tungsten or the like is filled into these openings so as to form the vias 104A, 104B.

Next, a metal layer is deposited. This metal layer is worked into a desired pattern by photolithography and etching processing, so as to form the lower electrode 105. Then, a capacitor insulating film layer is deposited, and is worked by photolithography and etching processing so as to form the capacitor insulating film pattern 106 to cover the lower electrode 105. At this time, the via 104B is exposed. Finally, a predetermined metal layer is layered thereon, and is worked by photolithography and etching processing so as to form the upper electrode 108 and the wirings 107A, 107B for leading an electrode.

Moreover, the semiconductor device equipped with a capacitor portion which is illustrated in FIG. 9 is known. The lower electrode 105, which is one electrode of a capacitor portion, is formed on the semiconductor substrate 100. The insulating film layer 103 is formed at both end portions of the lower electrode 105. The capacitor insulating film pattern 106 is formed on the insulating film layer 103 so as to cover the lower electrode 105 and the insulating film layer 103. Further, the upper electrode 108 is formed on the capacitor insulating film pattern 106 so as to cover the entire capacitor insulating film layer 106.

The semiconductor device equipped with a capacitor portion which is illustrated in FIG. 10H is also known. A metal layer 109, which becomes the lower electrode 105, is formed on the substrate 100 (see FIG. 10A). A resist pattern 102 is formed on the metal layer 109 (see FIG. 10B). The metal layer 109 is etched by using the resist pattern 102 as a mask, such that the lower electrode 105 is formed. The metal layer 109 which is to become the lower electrode 105 has a structure in which are layered a 100 nm Ti/TiN film (serving as a barrier metal) as the lowermost layer, and next, a 500 nm Al—Si—Cu (Si 3%, Cu 1%) film, and a 100 nm Ti/TiN film (for the purpose of preventing reflection) as the uppermost layer.

Thereon, a 100 nm CVD oxide film which is to become the capacitor insulating film pattern 106 is layered. A 100 nm Ti/TiN film, which serves as a metal layer 109B which is to become the upper electrode 108, is layered on the capacitor insulating film pattern 106 (see FIG. 10D). Then, the resist pattern 102 is formed thereon (see FIG. 10E). The metal layer 109B is etched by using the resist pattern 102 as a mask, so as to form the upper electrode 108 (see FIG. 10F).

Thereafter, an insulating film layer 110 serving as an inter-layer insulating layer is formed on the entire wafer surface. Planarizing (flattening) by CMP (chemical mechanical polishing) is carried out (see FIG. 10G), and an inter-layer film cap insulating film 111 is formed. The vias 104 are formed by photolithography and etching processing, and thereon, a metal layer 113 which supports the upper electrode is layered.

However, in the conventional methods for fabricating a semiconductor device equipped with a capacitor portion, the formation of the pattern of the lower electrode 105 by photolithography and etching processing, and the formation of the pattern of the capacitor insulating film 106 by photolithography and etching processing, are carried out independent of one another. Thus, there are drawbacks in that there are many processing steps, work is complicated, and costs increase.

Further, the capacitor insulating film pattern 106 which covers the end portions of the lower electrode 105 deteriorates (portion A in FIG. 8 and portion C in FIG. 9), and an electric field concentrates at a portion of the upper electrode 108 such that the breakdown voltage of the capacitor insulating film pattern 106 deteriorates (portion A in FIG. 8). In addition, due to the effect of the step formed by the underlayer wiring pattern 101A, the lower electrode 105 cannot be planarized well even if CMP is carried out, and there is the possibility that weak spots may arise in the capacitor insulating film pattern. Moreover, when the vias 104A are formed, a step is formed, and as a result, the flatness of the lower electrode 105 deteriorates, such that weak spots arise in the capacitor insulating film pattern. Due to this deterioration of properties, deterioration in breakdown voltage, and generation of weak spots, it is difficult for the capacitor insulating film pattern 106 to be made thin. A problem arises in that the capacity per unit surface area cannot be made large, which impedes the ability to make the semiconductor device more highly integrated.

Moreover, after formation of the lower electrode 105 and the capacitor insulating film pattern 106, the upper electrode 108 and the like are formed. Thus, at the stepped portions (portion B in FIG. 8, portion C in FIG. 9, and portion D in FIGS. 10F through 10H) of the end portions of the capacitor insulating film pattern 106, it is easy for metal wire remains 120 (see FIG. 10) at the time of etching processing to be generated. Problems arise such as these remains are a cause of short circuits occurring between adjacent patterns such that the reliability deteriorates.

SUMMARY OF THE INVENTION

The present invention was formed in order to overcome the above-described problems, and objects of the present invention are to provide a semiconductor device in which it is difficult for metal wire remains to be generated and in which reliability is improved, and to prevent a deterioration in breakdown voltage of a capacitor portion and aim for an increase in integration of semiconductor elements, and to decrease the number of fabrication processes so as to reduce costs.

In order to achieve the above object, a first aspect of the present invention is a method of fabricating a semiconductor device equipped with a capacitor portion, the method comprising the steps of: successively layering, on a substrate, a first metal layer which becomes a lower electrode and a wiring pattern, an insulating film layer, and a second metal layer which becomes an upper electrode; forming the upper electrode by subjecting the second metal layer to etching processing by using a resist pattern; forming a resist pattern for forming the lower electrode and the wiring pattern, at a region which covers the upper electrode; and etching the insulating film layer and the first metal layer in accordance with the resist pattern.

In accordance with the first aspect, first, the upper electrode is formed, and thereafter, the lower electrode is formed. Thus, no steps are formed at the first metal layer and the second metal layer. For example, no remains of metal wirings are generated at step portions at the time etching processing is carried out, and reliability can be improved.

Further, the upper electrode and the lower electrode are worked in that order. The lower electrode has a region which is wider than that of the upper electrode. Thus, the upper electrode is encompassed by the lower electrode, and there are no portions at the upper electrode which jut out beyond the lower electrode. Accordingly, the insulating film pattern is only the planarized portion directly beneath the upper electrode. Because a uniform electric field is applied, deterioration of breakdown voltage due to concentration of an electric field can be prevented. The insulating film pattern can be made smaller due to the insulating film layer being made more thin, and high integration is possible.

Further, after the upper electrode is formed, the resist pattern for forming the lower electrode is formed, and the insulating film layer and the first metal layer are subjected to etching processing. Namely, even if a pattern is not directly formed on the first metal layer, after a one-time process of forming a resist pattern for forming the lower electrode, the insulating film layer and the first metal layer are subjected to etching processing, such that the lower electrode and the wiring pattern can thereby be formed simultaneously. Accordingly, the number of processes can be reduced as compared to the number of processes in the conventional art.

In order to achieve the above-described object, a second aspect of the present invention is a method of fabricating a semiconductor device equipped with a capacitor portion, the method comprising the steps of: successively layering, on a substrate, a first metal layer which may become a lower electrode and a wiring pattern, a first insulating film layer, and a second metal layer which becomes an upper electrode; forming the upper electrode by subjecting the second metal layer to etching processing by using a resist pattern; layering a second insulating film layer on a surface of the substrate after the etching processing; forming, from above the second insulating film layer, a resist pattern for forming the lower electrode and the wiring pattern, at a region which covers the upper electrode; etching the first insulating film layer and the second insulating film layer in accordance with the resist pattern; and etching the first metal layer by using the first insulating film layer and the second insulating film layer as an etching mask.

In accordance with the second aspect, in addition to the operation and effects of the first aspect, the insulating film layer is formed on the entire surface after the upper electrode has been formed. At the time of forming the lower electrode and the wiring pattern, the first metal layer is subjected to etching processing by using the first insulating film layer and the second insulating film layer as an etching mask. Therefore, the aspect ratio at the time of etching the metal layer portions used as the wires can be reduced. Even if there are fine wires, stable working is possible, and high integration of the semiconductor device can be realized.

In order to achieve the above object, a third aspect of the present invention is a method of fabricating a semiconductor device equipped with a capacitor portion, the method comprising the steps of: successively layering, on a substrate, a first metal layer which may become a lower electrode and a wiring pattern, an insulating film layer, and a second metal layer which may become an upper electrode; forming, from above the second metal layer, a resist pattern for forming the lower electrode and the wiring pattern, at a region which covers a portion which may become the upper electrode; etching the second metal layer, the insulating film layer, and the first metal layer in accordance with the resist pattern; forming, on the second metal layer, a resist pattern for forming the upper electrode; and forming the upper electrode by etching the second metal layer in accordance with the resist pattern.

In accordance with the third aspect, first, the insulating film layer and the second metal layer which may become the upper electrode are formed. Thereafter, patterning is successively carried out such that the upper electrode, the lower electrode, and the like are formed. Thus, no steps are formed at the first metal layer or the second metal layer. No remains of metal wires are generated at the time of etching processing, and reliability is improved.

Further, because there are no corner portions at the insulating film layer between the upper electrode and the lower electrode, a lowering of breakdown voltage at end portions of the insulating film layer and a lowering of breakdown voltage caused by A deterioration of planarization can be prevented, and high integration is possible.

In order to achieve the above-described object, a fourth aspect of the present invention is a method of fabricating a semiconductor device equipped with a capacitor portion, the method comprising the steps of: layering, on a substrate, a first metal layer which may become a lower electrode and a wiring pattern; forming, on the first metal layer, a resist pattern for forming the lower electrode; etching the first metal layer in accordance with the resist pattern; layering a first insulating film layer on the first metal layer which has been subjected to etching; etching the first insulating film layer so as to leave portions, of the first insulating film layer, which are layered at openings between the lower electrode and the wiring pattern; layering a second insulating film layer and a second metal layer on the first metal layer which is exposed by the etching processing and on the first insulating film layer which is layered at the opening; and forming, on the second metal layer, a resist pattern for forming the upper electrode, and forming the upper electrode by etching the second metal layer in accordance with the resist pattern.

In accordance with the fourth aspect, the first insulating film layer is formed in advance at the opening between the lower electrode and the wiring pattern. Thus, thereafter, the second insulating film layer and the second metal layer are layered. No remains of the metal layer are generated at the time when the upper electrode and the like are formed, and reliability improves. Further, in the same way as in the third aspect, because there are no corner portions at the insulating film layer between the upper electrode and the lower electrode, a lowering of breakdown voltage at end portions of the insulating film layer and a lowering of breakdown voltage caused by a deterioration of planarization can be prevented, and high integration is possible.

In order to achieve the above-described object, a fifth aspect of the present invention is a method of fabricating a semiconductor device equipped with a capacitor portion, the method comprising the steps of: layering, on a substrate, a first metal layer which may become a lower electrode; oxidizing an upper layer portion of the first metal layer; layering a second metal layer, which may become an upper electrode, on the oxidized upper layer portion of the first metal layer; forming, from above the second metal layer, a resist pattern for forming the lower electrode and a wiring pattern, at a region which covers a portion which may become the upper electrode; etching the second metal layer and the first metal layer in accordance with the resist pattern; forming, on the second metal layer, a resist pattern for forming the upper electrode; and forming the upper electrode by etching the second metal layer in accordance with the resist pattern.

In accordance with the invention of the fifth aspect, there is no need to layer an insulating film layer on the lower electrode. Thus, the number of processes for fabricating the semiconductor device is reduced. Further, the first metal layer which may become the lower electrode and the second metal layer which may become the upper electrode are formed first, and thereafter, patterning is carried out successively, and the upper electrode, the lower electrode and the like are formed. Thus, no steps are formed at the first metal layer or the second metal layer. At the time of etching processing, no remains of the metal layers are generated, and reliability improves. Further, because there are no corner portions at the insulating film layer between the upper electrode and the lower electrode, a lowering of breakdown voltage at end portions of the insulating film layer and a lowering of breakdown voltage caused by a deterioration of planarization can be prevented, and high integration is possible.

Moreover, because the insulating film layer is formed by oxidation processing, a thinner insulating film layer can be formed precisely. Fabrication of a semiconductor device having a capacitor portion of an even greater capacity is possible.

In order to achieve the above-described object, a sixth aspect of the present invention is a method of fabricating a semiconductor device equipped with a capacitor portion, the method comprising the steps of: layering, on a substrate, a first metal layer which may become a lower electrode; nitriding an upper layer portion of the first metal layer; layering a second metal layer, which may become an upper electrode, on the nitrided upper layer portion of the first metal layer; forming, from above the second metal layer, a resist pattern for forming the lower electrode and a wiring pattern, at a region which covers a portion which may become the upper electrode; etching the second metal layer and the first metal layer in accordance with the resist pattern; forming, on the second metal layer, a resist pattern for forming the upper electrode; and forming the upper electrode by etching the second metal layer in accordance with the resist pattern.

In accordance with the sixth aspect, in addition to the operation and effects of the fifth aspect, due to the upper layer portion of the first metal layer being nitrided, the capacitor portion of the fabricated semiconductor device can have a greater capacity than in the case in which the upper layer portion of the first metal layer is oxidized.

BRIEF DESCRIPTION OF THE DRAWINGS

FIGS. 1A to 1G are sectional views showing a process of fabricating a semiconductor device equipped with a capacitor portion relating to a first embodiment of the present invention.

FIGS. 10A to 10H are sectional views showing a process of fabricating yet another conventional semiconductor device equipped with a capacitor portion.

DETAILED DESCRIPTION OF THE PREFERRED EMBODIMENTS

Figure 2E:
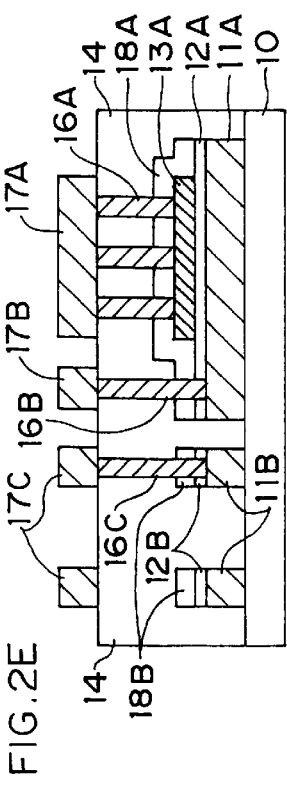
FIGS. 2A to 2E are sectional views showing a process of fabricating a semiconductor device equipped with a capacitor portion relating to a second embodiment of the present invention.

Embodiments of the present invention will be described in detail hereinafter with reference to the drawings.
(First Embodiment)
FIGS. 1A–1G shows a method of fabricating a semiconductor device equipped with a capacitor (specifically, an MIM (metal insulator metal) capacitor) portion, which is a first embodiment of the present invention.

As shown in FIG. 1A, first, a first metal layer 11 is formed on a semiconductor substrate 10 on which elements such as transistors and the like are formed. The first metal layer 11 is to become a lower electrode 11A, which is one electrode of the capacitor portion, and metal wiring patterns 11B. Specifically, the first metal layer 11 is formed, for example, by layering first 10 nm of Ti, then 50 nm of TiN, then 500 nm of Al—Cu, and finally 10 nm of Ti by spattering technique.

Next, a capacitor insulating film layer 12 is formed on the metal layer 11. Specifically, for example, an oxide film of 50 nm is layered by plasma enhanced chemical vapor deposition (PE-CVD).

A second metal layer 13, which is to become an upper electrode 13A (FIG. 1B) which is another electrode of the capacitor portion, is formed on the capacitor insulating film layer 12. Specifically, for example, 100 nm of TiN is layered.

Then, as shown in FIG. 1B, a resist pattern for forming the upper electrode 13A is formed on the metal layer 13 by photolithography. By using a photoresist 21 as an etching mask, the metal layer 13 is subjected to etching processing such that the upper electrode 13A is formed. At this time, the metal wiring patterns 11B (FIG. 1D) of the lower layer are not yet formed, and thus, there is no step that could lead to the formation of metal wire layer remains.

Thereafter, as shown in FIG. 1C, a resist pattern for forming the lower electrode 11A and the metal wiring pattern 11B is formed by photolithography.

Figure 3:
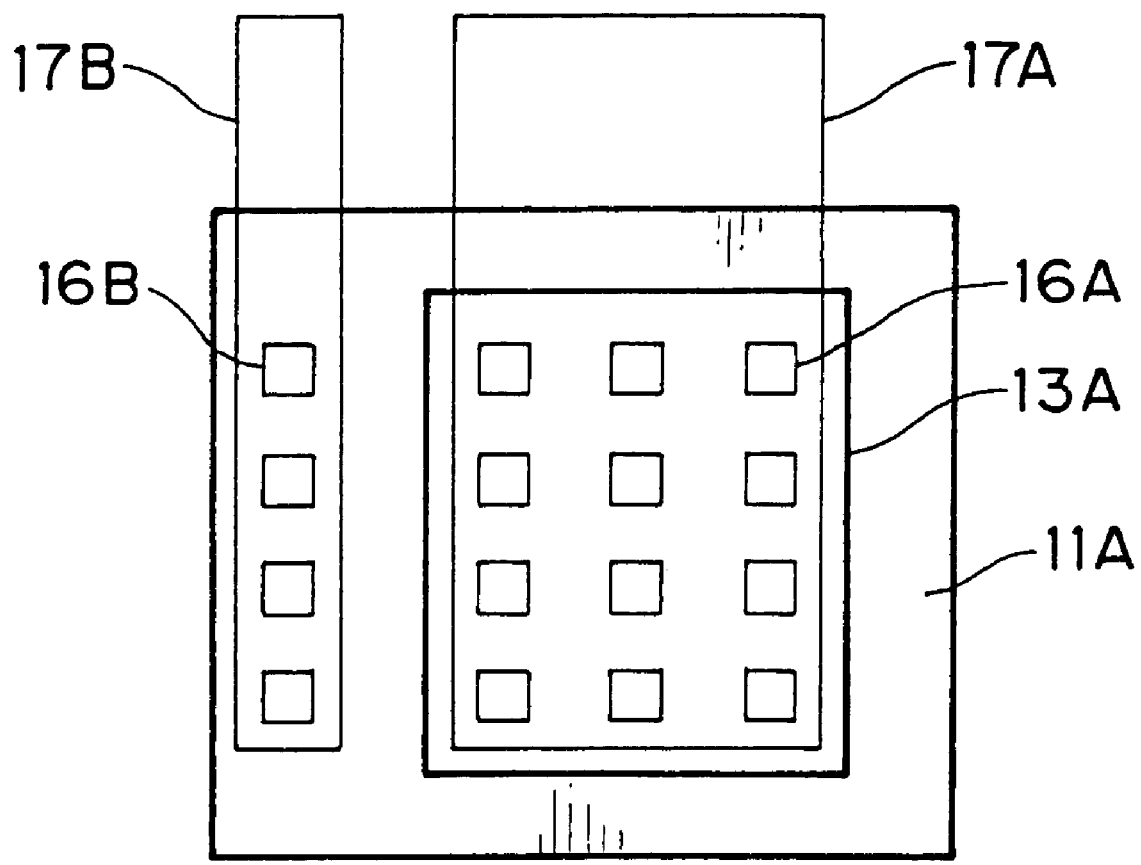
FIG. 3 is a schematic plan view for explanation, which illustrates a pattern of a capacitor portion in the semiconductor devices relating to the first embodiment and the second embodiment of the present invention.

Next, as shown in FIG. 1D, the capacitor insulating layer 12 is etched in accordance with the resist pattern and by using a photoresist 22 as an etching mask, such that capacitor insulating film patterns 12A, 12B are formed. Then, the metal layer 11 is etched such that the lower electrode 11A and the metal wiring patterns 11B are formed. At this time, the lower electrode 11A completely encompasses the region occupied by the upper electrode 13A, and has a wider region (see FIG. 3).

Next, an insulating film layer 14 is formed, and planarization is carried out. Specifically, as shown in FIG. 1E, for example, after a 1500 nm PE-CVD oxide film is formed, the insulating film layer 14, which is planarized by 700 nm polishing by CMP (chemical mechanical polishing), is formed.

Then, as shown in FIG. 1E, openings 15A for leading the upper electrode, opening 15B for leading the lower electrode, and opening 15C for leading another wiring layer, are formed in the insulating film layer 14 by photolithography and etching processing. Moreover, as shown in FIG. 1F, vias 16A, 16B, 16C are formed in the openings 15A, 15B, 15C by filling in the openings 15A, 15B, 15C by, for example, spattering tungsten or the like and carrying out etching-back.

A metal wiring layer (not shown) is formed on the vias 16A, 16B, 16C and the insulating film layer 14. Thereafter, as shown in FIG. 1G, a wiring pattern 17A for leading the upper electrode, a wiring pattern 17B for leading the lower electrode, and other wiring patterns 17C are formed by photolithography and etching processing. By the above-described processes, a semiconductor device equipped with a capacitor portion, upper and lower electrode patterns, wiring patterns for leading thereto, and the like, is formed.

Note that a desired semiconductor integrated circuit is fabricated if other elements (e.g., transistors and the like) are connected to the capacitor portion fabricated in this way.

In accordance with the present first embodiment, the capacitor portion is formed directly on the semiconductor substrate 10. After resist pattern formation and etching processing for forming the upper electrode 13A are carried out, a resist pattern is formed for forming the lower electrode 11A and the metal wiring patterns 11B. Thereafter, the capacitor insulating film layer 12 and the metal layer 11 are subjected to etching processing in order. Namely, there is no need to separately carry out resist pattern formation for forming the lower electrode 11A and the metal wiring patterns 11B and resist pattern formation for forming the capacitor insulating film pattern 12A. In a single resist pattern formation process, the patterns of the lower electrode 11A, the metal wiring patterns 11B, and the capacitor insulating film patterns 12A, 12B can be formed. Thereafter, by subjecting the metal layer 11 and the capacitor insulating film layer 12 to etching processing, the lower electrode 11A, the metal wiring patterns 11B, and the capacitor insulating film patterns 12A, 12B are formed. This shows that, during the entire process for fabricating the semiconductor device, resist pattern formation which is necessary for fabricating the capacitor portion requires only a process for forming the upper electrode 13A. Accordingly, in accordance with the present embodiment, the number of processes for fabricating the capacitor portion within the semiconductor device can be decreased, and as a result, the number of processes for fabricating the semiconductor device can be decreased.

Further, the upper electrode 13A is formed first, and then thereafter, the lower electrode 11A is formed. Thus, no steps are formed at the metal layers 13, 11, and no remains of a metal layer at step portions are generated at the time of etching the metal layers. Accordingly, stable working is possible, and the problem of short circuits arising between adjacent patterns can be prevented.

Moreover, working is carried out such that the upper electrode 13A is worked first, and then the lower electrode 11A is worked thereafter. The lower electrode 11A has a wide region which completely encompasses the region occupied by the upper electrode 13A. Thus, the upper electrode pattern 13A is encompassed by the lower electrode pattern 11A, and the upper electrode pattern 13A does not jut out from the lower electrode pattern 11A. Accordingly, only the capacitor insulating film pattern 12A beneath the upper electrode 13A is a planarized portion, and a uniform electric field is applied to the capacitor insulating film. Thus, the capacitor insulating film layer can be made thin, and the capacitor insulating film pattern 12A can be made smaller.

(Second Embodiment)

FIGS. 2A–2E show a process of fabricating a semiconductor device equipped with a capacitor portion relating to a second embodiment of the present invention. Hereinafter, the structure and method thereof will be described in order following the description of the fabrication processes.

In the same way as in the above-described first embodiment, the first metal layer 11, which is to become the lower electrode 11A and the metal wiring patterns 11B, and the second metal layer 13, which is to become the upper electrode 13A, are layered on the semiconductor substrate 10. A desired resist pattern is formed by photolithography on the metal layer 13, and the metal layer 13 is subjected to etching processing such that the upper electrode 13A is formed.

Figure 2A:
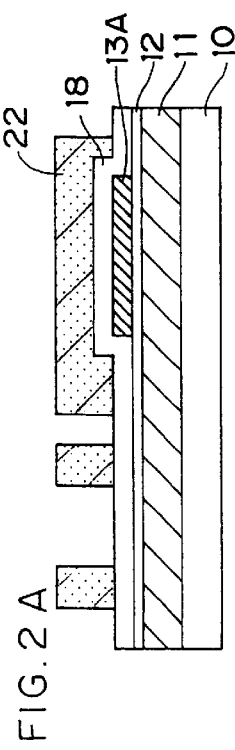
Figure 2B:
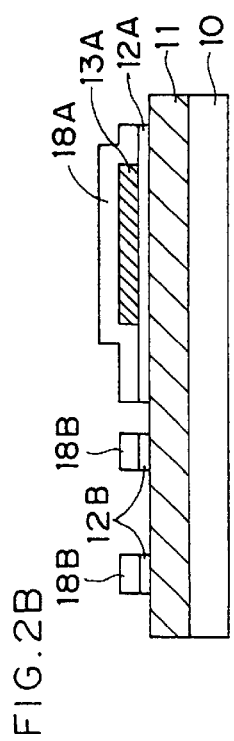

Thereafter, as shown in FIGS. 2A and 2B, an insulating film layer 18, e.g., 100 nm of a PE-CVD oxide film, is layered on the entire surface of the wafer. Then, in order to form the lower electrode 11A and the metal wiring patterns 11B, a resist pattern is formed by photolithography.

Figure 2C:
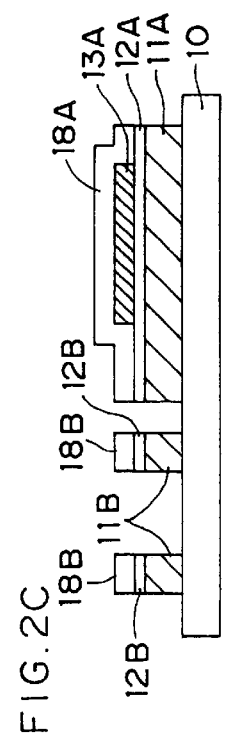

Next, the insulating film layer 18 and the capacitor insulating film layer 12 are etched in accordance with the resist pattern and by using the photoresist 22 as an etching mask, so as to form insulating film patterns 18A, 18B and the capacitor insulating film patterns 12A, 12B. Thereafter, the photoresist 22 is removed. Further, as shown in FIG. 2C, by using the insulating film patterns 18A, 18B and the capacitor insulating film patterns 12A, 12B as an etching mask, the metal layer 11 is subjected to etching processing so as to form the upper electrode 11A and the metal wiring patterns 11B. Note that the lower electrode 11A has a wide region which completely encompasses the region occupied by the upper electrode 13A (see FIG. 3).

Figure 2D:
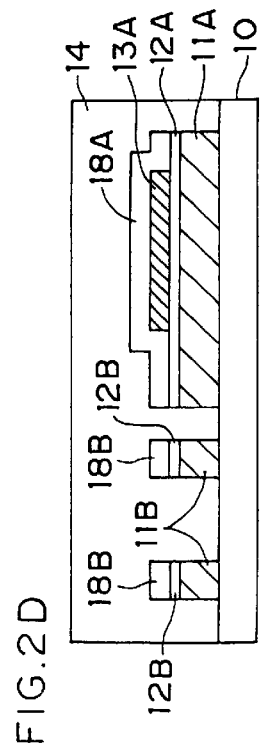

Next, as shown in FIG. 2D, the insulating film layer 14 is formed, and planarization is carried out. Specifically, after, for example, a PE-CVD oxide film of 1500 nm is formed, an insulating film layer, which is planarized by 700 nm polishing by CMP, is formed.

Next, openings for leading the upper electrode, for leading the lower electrode, and for leading other wiring layers are formed in the insulating film layer 14 by photolithography and etching processing. Then, by spattering, for example, tungsten in these openings and carrying out etchback, the openings are filled-in such that the vias 16A, 16B, 16C are formed.

Further, after formation of a metal wiring layer (not shown), a desired resist pattern is formed by photolithography. Etching processing is carried out such that the wiring pattern 17A for leading the upper electrode, the wiring pattern 17B for leading the lower electrode, and the wiring patterns 17C for other patterns are formed. By the above-described processes, a capacitor portion is formed within the semiconductor device, and the wirings for 17A, 17B, 17C for leading the upper and lower electrodes 13A, 11A and the like are formed.

In the same way as in the previously-described first embodiment, a semiconductor device is fabricated if other elements (e.g., transistors and the like) are connected to the capacitor portion fabricated in this way.

As described above, in accordance with the present second embodiment, in the same way as in the first embodiment, the resist pattern of the lower electrode 11A is formed by a single photolithographic process. By subjecting the insulating film layer 18 and the capacitor insulating film layer 12 to etching processing in accordance with this resist pattern, the insulating film pattern 18A and the capacitor insulating film pattern 12A can be formed by using the same resist pattern. Namely, resist pattern formation by photolithography, which is necessary in order to fabricate the capacitor portion, is carried out only a single time, and the number of processes for fabricating the capacitor portion can be reduced.

Further, because the lower electrode 11A is formed after the upper electrode 13A is formed, the metal layers 13, 11 are not formed in stepped forms. Stable working can be carried out without remains of the metal layer being generated at step portions at the time the metal layer is etched, and there is no fear of the problem of shorting arising between adjacent patterns.

The lower electrode 11A has a wide region which completely encompasses the region occupied by the upper electrode 13A. Thus, the upper electrode 13A is encompassed by the lower electrode 11A, and the upper electrode 13A does not just out from the lower electrode 11A. Accordingly, only the capacitor insulating film pattern 12A directly beneath the upper electrode 13A is a planarized portion, and a uniform electric field is applied to the capacitor insulating film pattern. Thus, the capacitor insulating film pattern 12A can be made smaller by the capacitor insulating film layer 12 being made thinner.

Further, after the upper electrode 13A is formed, the insulating film layer 18 is formed on the entire surface of the wafer. At the time the lower electrode 11A and the metal wiring patterns 11B are formed, the metal layer 11 is subjected to etching processing by using the insulating film layer 18 (the insulating film patterns 18A, 18B) and the capacitor insulating film layer 12 (the capacitor insulating film patterns 12A, 12B) as an etching mask. Thus, the aspect ratio at the time of etching the metal portions which are used as wirings can be made small, and stable working is possible even at finer wirings. Moreover, because the wiring of a highly integrated device and the formation of an electrostatic capacitor electrode can thereby be carried out simultaneously, costs can be decreased.

In the second embodiment, an example is described in which the wire for leading the lower electrode is formed within the same layer as the wire for leading the upper electrode. However, the lower electrode may, for example, be connected to a transistor or the like beneath the wiring layer.

(Third Embodiment)

FIGS. 4A–4G show processes of fabricating a semiconductor device equipped with a capacitor portion, which is a third embodiment of the present invention. The structure and method thereof will be described hereinafter.

Figure 4A:
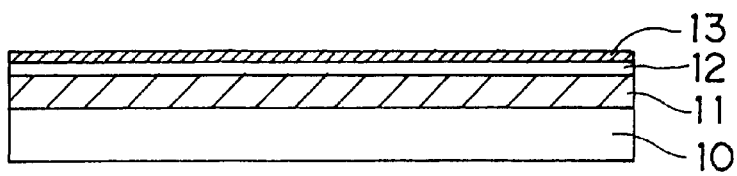
FIGS. 4A to 4G are sectional views showing a process of fabricating a semiconductor device equipped with a capacitor portion relating to a third embodiment of the present invention.

As shown in FIG. 4A, first, the first metal layer 11 is formed on the semiconductor substrate 10. The first metal layer 1 is to become the lower electrode 11A, which is one electrode of the capacitor portion, and the metal wiring pattern 11B. Specifically, for example, first, a 100 nm Ti/TiN film is layered, and next, a 500 nm Al—Si (3%)-Cu (1%) film is layered, and then, a 100 nm Ti/TiN film is layered.

Next, the capacitor insulating film layer 12 is formed on the metal layer 11. Specifically, a 100 nm CVD oxide film is layered by plasma enhanced chemical vapor deposition (PE-CVD).

The second metal layer 13, which is to become the upper electrode 13A which is another electrode of the capacitor portion, is formed on the capacitor insulating film layer 12. Specifically, for example, a 100 nm Ti/TiN film is layered.

Figure 4B:
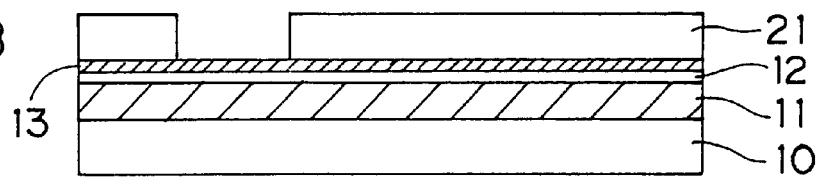
Figure 4C:
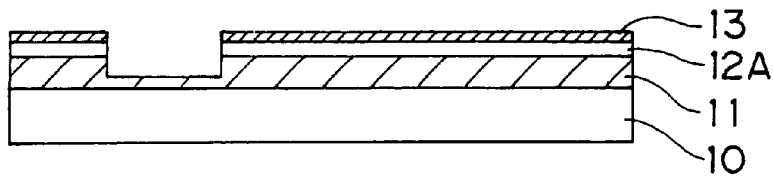

Then, as shown in FIG. 4B, a resist pattern for forming a desired pattern is formed on the metal layer 13 by photolithography. By using the photoresist 21 as an etching mask, the metal layer 13 and the capacitor insulating film layer 12 are subjected to etching processing such that the capacitor insulating film pattern 12A is formed. At this time, the Ti/TiN film which is the upper layer portion of the metal layer 11 and the Al—Si—Cu film are simultaneously etched (see FIG. 4C), and the photoresist 21 which is no longer needed is removed. Note that, in a case in which the capacitor insulating film layer 12 is thick, the metal layer 11 can be removed by a single etching processing.

Figure 4D:
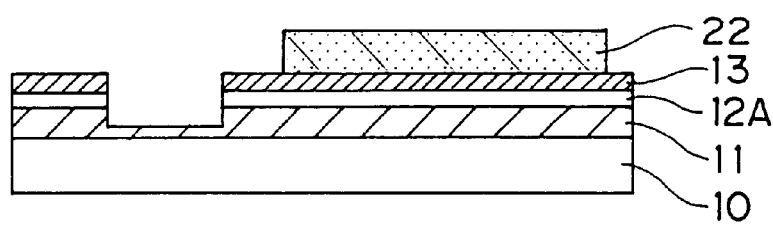
Figure 4E:
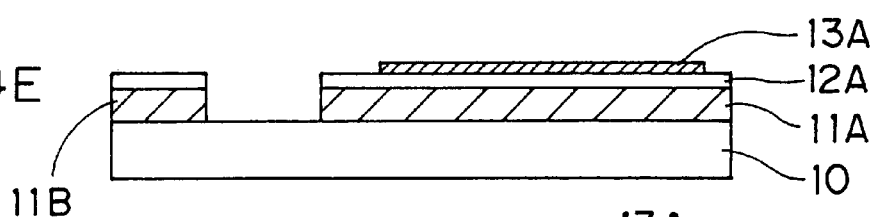
Figure 4F:
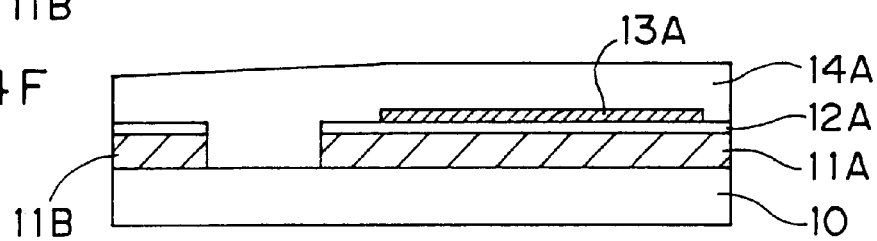
Figure 4G:
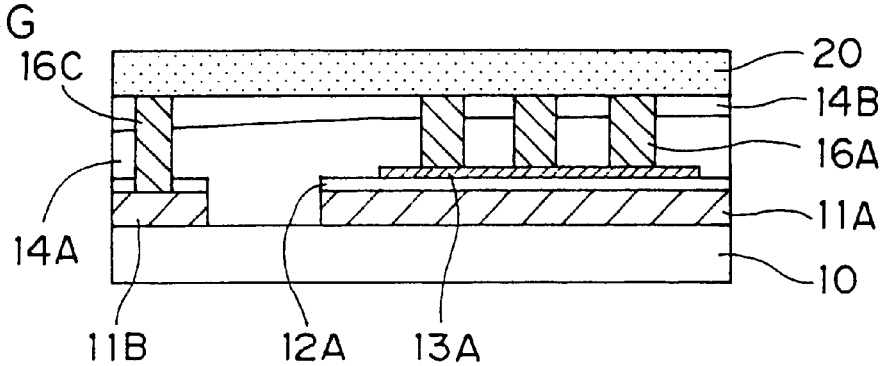

Thereafter, as shown in FIG. 4D, a resist pattern for forming the upper electrode 13A is formed by photolithography. Next, the metal layer 13 is subjected to etching processing in accordance with the resist pattern and by using the photoresist 22 as an etching mask, and simultaneously, the lower layer portion of the metal layer 11, which remains from the time of a previous etching processing, is subjected to etching processing, and the photoresist 22 which is no longer needed is removed. The upper electrode 13A, the lower electrode 11A, and the metal wiring pattern 11B are thus formed (see FIG. 4E).

Here, even if etching were to be carried out excessively, there would be no fear that the necessary portions such as, for example, the region to become the lower electrode 11A or the like, would be etched, because the lower layer portion of the metal layer 11 is protected by the capacitor insulating film 12. Further, the lower electrode 11A has a wide region which completely encompasses the region occupied by the upper electrode 13A (see FIG. 3).

Next, an insulating film layer 14A is formed (see FIG. 4F), and a cap insulating film layer 14B is formed and planarization is carried out. Then, by processes which are the same as in the first embodiment, the vias 16A, 16C are formed. Moreover, the metal wiring layer 20, which supports the upper electrode 13A, is formed on the vias 16A, 16C and the cap insulating film layer 14B. By the above processes, a semiconductor device equipped with a capacitor portion is formed.

Note that a desired semiconductor integrated circuit device is fabricated if other elements (e.g., transistors and the like) are connected to the capacitor portion fabricated in this way.

In accordance with the third embodiment, first, the capacitor insulating film 12 which becomes the capacitor insulating film pattern 12A and the metal layer 13 which becomes the upper electrode 13A are formed. Thereafter, patterning is carried out successively, and the upper electrode 13A, the capacitor insulating film pattern 12A, and the lower electrode 11A are formed. Thus, no steps are formed at the metal layers 13, 11. As a result, when the upper electrode 13A is formed at the side wall of the lower electrode 11A, no remains of the metal layer are generated during etching processing. Accordingly, stable working of the upper electrode is possible, and the problem of short circuits arising between adjacent patterns can be prevented.

Further, there are no corner portions at the capacitor insulating film pattern 12A. Thus, a deterioration of breakdown voltage at the end portions of the capacitor insulating film pattern 12A, and a deterioration of breakdown voltage of the capacitor insulating film caused by a deterioration in the planarity of the upper electrode can be prevented. The reliability of the capacitor portion improves, and the yield improves.

(Fourth Embodiment)

FIGS. 5A through 5F show a process for fabricating a semiconductor device equipped with a capacitor portion which is a fourth embodiment of the present invention. Hereinafter, the structure and method thereof will be described.

Figure 5A:
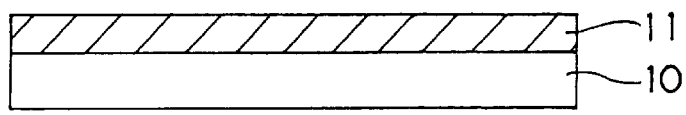
FIGS. 5A to 5F are sectional views showing a process of fabricating a semiconductor device equipped with a capacitor portion relating to a fourth embodiment of the present invention.
Figure 5B:
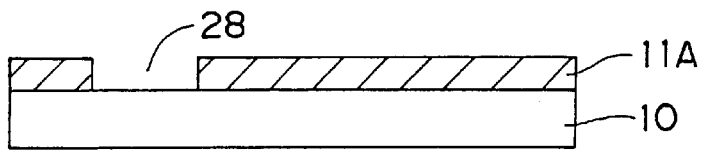

As shown in FIG. 5A, first, the first metal layer 11 is formed on the semiconductor substrate 10. The first metal layer is to become the lower electrode 11A, which is one electrode of the capacitor portion, and the metal wiring pattern 11B. Next, as shown in FIG. 5B, a resist pattern for forming a desired pattern is formed on the metal layer 11 by photolithography. Etching processing is carried out by using an unillustrated photoresist as a mask, such that the lower electrode 11A, the wiring pattern 11B, and an opening 28 are formed. Thereafter, the photoresist is removed.

Figure 5C:
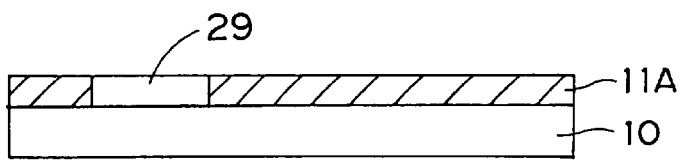
Figure 5D:
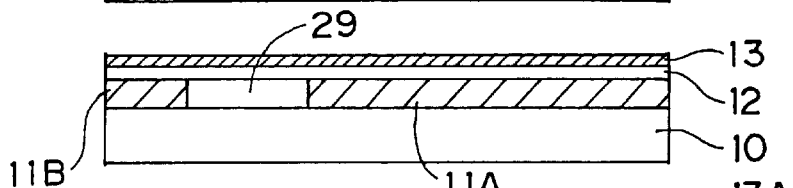
Figure 5E:
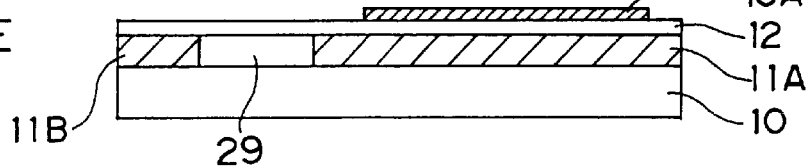
Figure 5F:
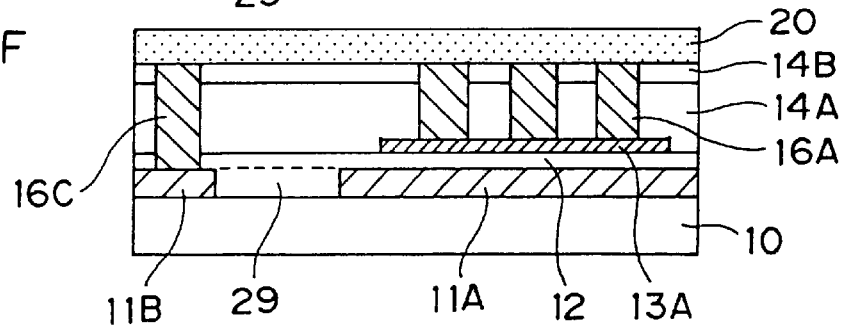

Next, as shown in FIG. 5C, an insulating film layer (not shown) is formed on the entire surface. The unneeded portions of the insulating film layer are removed by etching or CMP, such that an insulating film layer 29 is filled in the opening 28. As shown in FIG. 5D, the capacitor insulating film layer 12 and the metal layer 13 are formed thereon. Then, as shown in FIG. 5E, a resist pattern for forming the upper electrode 13A is formed on the metal layer 13 by photolithography. The metal layer 13 is etched by using an unillustrated photoresist as an etching mask, the photoresist is removed, and the upper electrode 13A is formed.

Next, the insulating film layer 14A is formed (see FIG. 5F), the cap insulating film layer 14B is formed, and planarization is carried out. Then, by the same processes as in the first embodiment, the vias 16A, 16C are formed. The metal wiring layer 20, which supports the upper electrode 13A, is formed on the vias 16A, 16C and the gap insulating film layer 14B. By the above-described processes, a semiconductor device equipped with a capacitor portion is formed.

Note that a desired semiconductor integrated circuit device is fabricated if other elements (e.g., transistors and the like) are connected to the capacitor portion fabricated in this way.

In accordance with the present fourth embodiment, the insulating film layer 29 is filled-in in advance at the step portion of the sidewall of the lower electrode 11A, i.e., is filled into the opening 28. Therefore, no metal layer remains are generated at the time of forming the capacitor insulating film pattern 12A and the upper electrode 13A, which processes are carried out thereafter. A reliable semiconductor device equipped with a capacitor portion is formed, and the yield improves. In the method for fabricating a semiconductor device equipped with a capacitor portion relating to the present embodiment, it is easy to fill the insulating film in even when the opening 28 is small, and fabrication of an even finer semiconductor device is possible.

Figure 6:
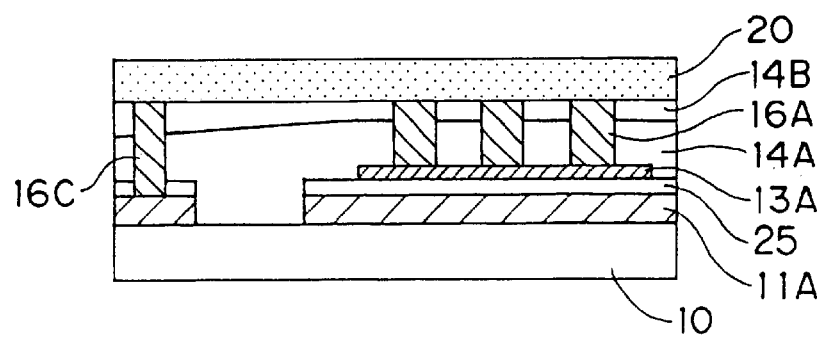
FIG. 6 is a sectional schematic view for explanation of a case in which a nitride film is used as a capacitor insulating film pattern in the capacitor portion of the semiconductor device relating to the present invention.

In the above-described embodiments, a CVD oxide film is used as the capacitor insulating film pattern 12A. However, when the film thickness of a CVD oxide film is 50 nm or less, there are cases in which control of the film thickness is poor and there is much dispersion. (In the case in which a regular oxide film is used, the capacity is about 0.5 fF/$\mu m^2$ when the film thickness is about 70 nm, and the capacity is about 1.0 fF/$\mu m^2$ when the film thickness is about 35 nm.) Depending on the characteristics of the elements, there are cases in which a larger capacity is required. In such cases, a nitride film can be used. In order to obtain a capacity of about 1.0 fF/$\mu m^2$, a film thickness of the nitride film of about 65 nm suffices. With a nitride film, a larger capacity is obtained than that which would be obtained by an oxide film of the same film thickness. In order to obtain the same capacity, the film thickness of a nitride film can be made greater than that of an oxide film. Thus, the control of the film thickness is improved. Accordingly, for example, as illustrated in FIG. 6, the capacitor insulating pattern 12A of the capacitor portion of FIG. 4G or FIG. 5F may be formed by a CVD nitride film pattern 25 having a film thickness of about 10 to 100 nm.

(Fifth Embodiment)

In the present fifth embodiment, the capacitor insulating film pattern is formed by oxidizing or nitriding the uppermost portion layer of the metal layer 11 which is to become the lower electrode 11A.

Figure 7A:
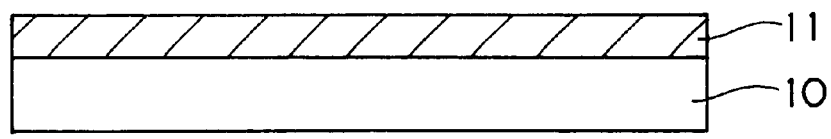
FIGS. 7A to 7D are sectional views showing a process of fabricating a semiconductor device equipped with a capacitor portion relating to a fifth embodiment of the present invention.

As shown in FIG. 7A, the metal layer 11 is formed on the semiconductor substrate 10. The metal layer 11 is formed by layering a 100 nm Ti/TiN film which functions as a barrier metal as the lowermost layer, and thereon, a 500 nm Al—Si (3%)-Cu (1%) film serving as an aluminum alloy film, and as the uppermost layer, a 100 nm Ta film which functions as a reflection preventing film.

Figure 7B:
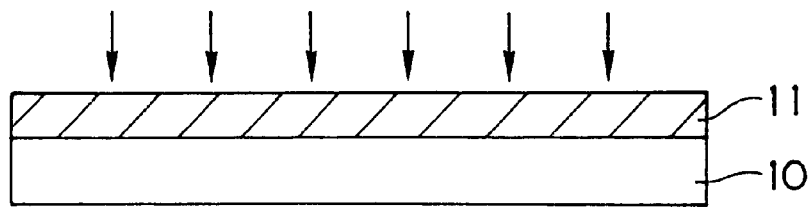

Next, as shown in FIG. 7B, in the metal layer 11, oxygen plasma, i.e., active particles such as oxide ions or oxygen radicals or the like, are radiated on the Ta film which is the uppermost layer (as shown by the arrows in FIG. 7B). Here, oxygen gas may be made into plasma by using a dry etching device which is used in regular etching or the like. For example, the oxygen gas may be made into plasma in a parallel flat-plate type plasma etching device at a pressure of 3 to 50 Mtorr, an oxygen gas flow rate of 10 to 200 cc, and an RF power of 0.5 to 2 KW.

Figure 7C:
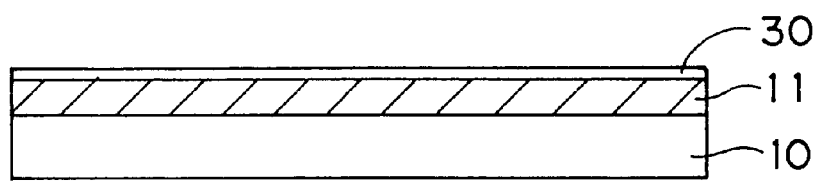
Figure 7D:
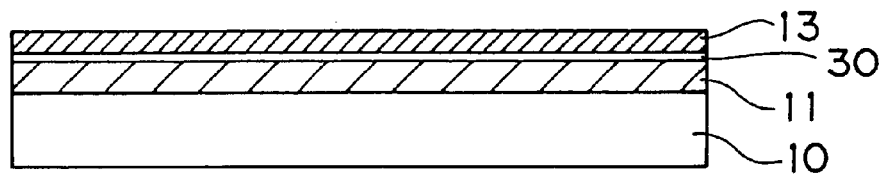
Figure 8:
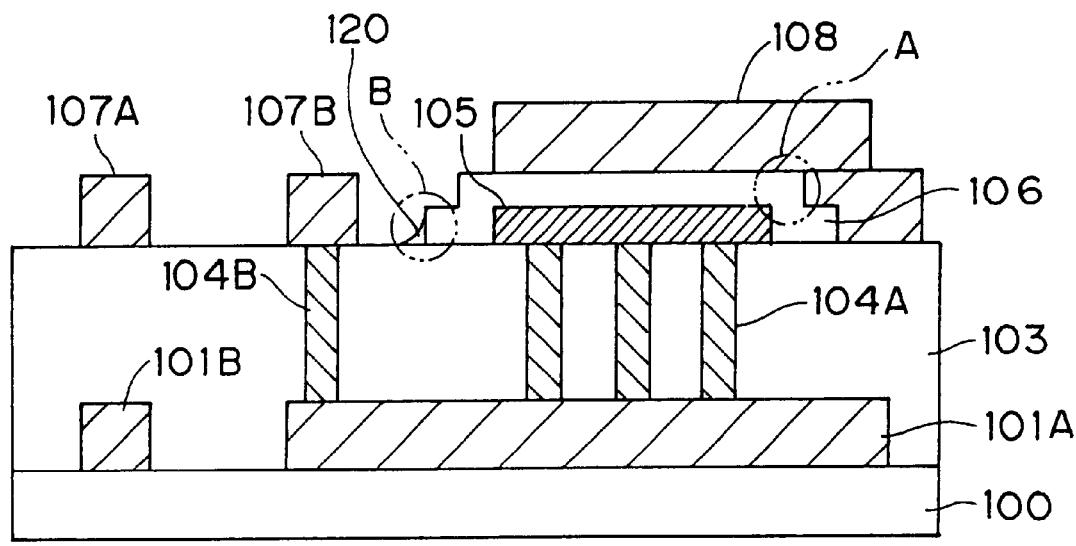
FIG. 8 is a sectional view showing a structure of a conventional semiconductor device equipped with a capacitor portion.
Figure 9:
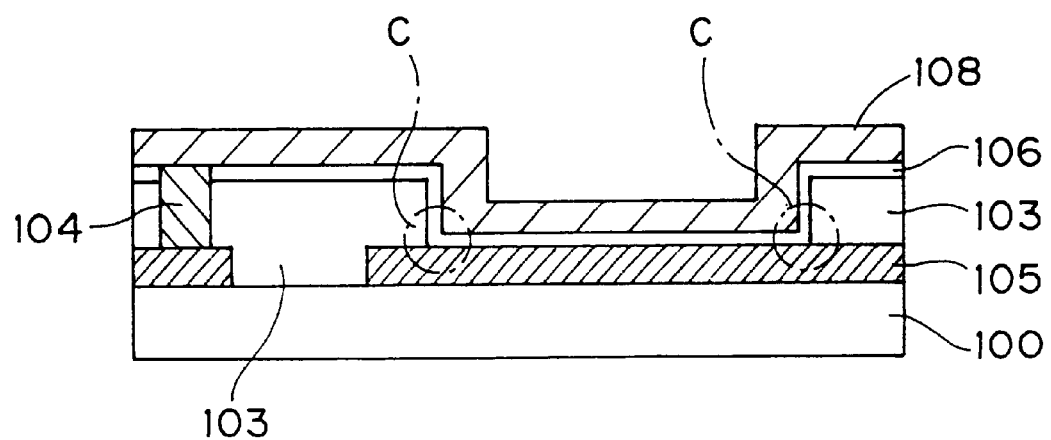
FIG. 9 is a sectional view showing a structure of another conventional semiconductor device equipped with a capacitor portion.

By radiating the oxygen plasma, as shown in FIG. 7C, the uppermost layer of the metal layer 11 oxidizes and becomes a Ta oxide film 30. Although the film thickness of the Ta oxide film 30 may be appropriately adjusted, the film thickness is usually about 5 to 20 nm. Then, as shown in FIG. 7D, the metal layer 13 which is to become the upper electrode is formed on the Ta oxide film 30. In this way, a state which is the same as that shown in FIG. 4B arises. Thereafter, by carrying out patterning successively in accordance with a method for fabricating a semiconductor device relating to the above-described embodiments, a semiconductor device equipped with a capacitor portion is formed.

In the above description, a Ta film is used as the oxidized film. However, the present invention is not limited to the same, and, for example, an amorphous Si film, a Ti film or the like may be oxidized by plasma processing, or another film having an appropriate dielectric constant may be used. Further, a nitride film may be formed by using nitrogen during plasma processing.

In this way, in accordance with the present embodiment, there is no need to layer an insulating film layer which becomes a capacitor insulating film pattern. Thus, the number of processes for fabricating the semiconductor device can be reduced. Further, because the capacitor insulating film pattern is formed by oxidation processing or nitriding processing, a thinner capacitor insulating film pattern is formed precisely. Fabrication of a semiconductor device having a capacitor portion of an even larger capacity is possible.

In the present embodiment, as specific examples, Al—Cu or the like is used for the lower electrode, and TiN or the like is used for the upper electrode. However, the present invention is not limited to the same, and other metals may be used. Further, an example has been described in which a CVD-Si oxide film or a nitride film or the like is used as the capacitor insulating film. However, other insulating films may be used. In particular, in a case in which a capacitor portion having a large capacity is required, insulating films such as the following which have higher dielectric constant can be used. Specifically, films such as Hf (hafnium) oxide film, Zr (zirconium) oxide film, Ta (tantalum) oxide film, alumina (Al2O3) oxide film, BST (barium/strontium/titanium) composite oxide film, SBT (strontium/bismuth/titanium) composite oxide film, PZT (lead/zirconium/titanium) composite oxide film and the like can be used.

What is claimed is:

1. A method of fabricating a semiconductor device equipped with a capacitor portion, the method comprising the steps of:

successively layering, on a substrate, a first metal layer which becomes a lower electrode and a wiring pattern, an insulating film layer, and a second metal layer which becomes an upper electrode;

forming the upper electrode by subjecting the second metal layer to etching processing by using a first resist pattern;

forming a second resist pattern for forming the lower electrode and the wiring pattern, at a region which covers the upper electrode; and etching the insulating film layer and the first metal layer in accordance with the second resist pattern.

2. The method of claim 1, wherein said first metal layer includes Al—Cu film and said second metal layer includes TiN film.

3. The method of claim 1, wherein said insulating film layer includes silicon oxide film.

4. The method of claim 1, wherein said insulating film layer includes high dielectric constant film.

5. A method of fabricating a semiconductor device equipped with a capacitor portion, the method comprising the steps of:

successively layering, on a substrate, a first metal layer which becomes a lower electrode and a wiring pattern, a first insulating film layer, and a second metal layer which becomes an upper electrode;

forming the upper electrode by subjecting the second metal layer to etching processing by using a first resist pattern;

layering a second insulating film layer on a surface of the substrate after the etching processing;

forming, from above the second insulating film layer, a second resist pattern for forming the lower electrode and the wiring pattern, at a region which covers the upper electrode;

etching the first insulating film layer and the second insulating film layer in accordance with the second resist pattern; and etching the first metal layer by using the first insulating film layer and the second insulating film layer as an etching mask.

6. The method of claim 5, wherein said first metal layer includes Al—Cu film and said second metal layer includes TiN film.

7. The method of claim 5, wherein said second insulating film layer includes silicon oxide film.

8. The method of claim 5, wherein said second insulating film layer includes high dielectric constant film.

9. A method of fabricating a semiconductor device equipped with a capacitor portion, the method comprising the steps of:

successively layering, on a substrate, a first metal layer which becomes a lower electrode and a wiring pattern, an insulating film layer, and second metal layer which becomes an upper electrode;

forming, from above the second metal layer, a first resist pattern for forming the lower electrode and the wiring pattern, at a region which covers a portion which becomes the upper electrode;

etching the second metal layer, the insulating film layer, and the first metal layer in accordance with the first resist pattern;

forming, on the second metal layer, a second resist pattern for forming the upper electrode; and forming the upper electrode by etching the second metal layer in accordance with the second resist pattern.

10. The method of claim 9, wherein said first metal layer includes Al—Cu film and said second metal layer includes TiN film.

11. The method of claim 9, wherein said insulating film layer includes silicon oxide film.

12. The method of claim 9, wherein said insulating film layer includes high dielectric constant film.

13. A method of fabricating a semiconductor device equipped with a capacitor portion, the method comprising the steps of:

layering, on a substrate, a first metal layer which becomes a lower electrode and a wiring pattern;

forming, on the first metal layer, a first resist pattern for forming the lower electrode;

etching the first metal layer in accordance with the first resist pattern;

layering a first insulating film on the first metal layer which has been subjected to etching;

etching the first insulating film so as to leave portions, of the first insulating film layer, which are layered at openings between the lower electrode and the wiring pattern;

layering a second insulating film layer and a second metal layer on the first metal layer which is exposed by the etching processing and on the first insulating film layer which is layered at the opening; and forming, on the second metal layer, a second resist pattern for forming the upper electrode, and forming the upper electrode by etching the second metal layer in accordance with the second resist pattern.

14. The method of claim 13, wherein said first metal layer includes Al—Cu film and said second metal layer includes TiN film.

15. The method of claim 13, wherein said second insulating film layer includes silicon oxide film.

16. The method of claim 13, wherein said second insulating film layer includes high dielectric constant film.

17. A method of fabricating a semiconductor device equipped with a capacitor portion, the method comprising the steps of:

layering, on a substrate, a first metal layer which becomes a lower electrode;

oxidizing an upper layer portion of the first metal layer;

layering a second metal layer, which becomes an upper electrode, on the oxidized upper layer portion of the first metal layer;

forming, from above the second metal layer, a first resist pattern for forming the lower electrode and a wiring pattern, at a region which covers a portion which becomes the upper electrode;

etching the second metal layer and the first metal layer in accordance with the first resist pattern;

forming, on the second metal layer, a second resist pattern for forming the upper electrode; and forming the upper electrode by etching the second metal layer in accordance with the second resist pattern.

18. The method of claim 17, wherein said first metal layer includes Al—Cu film and said second metal layer includes TiN film.

19. A method of fabricating a semiconductor device equipped with a capacitor portion, the method comprising the steps of:

layering, on a substrate, a first metal layer which becomes a lower electrode;

nitriding an upper layer portion of the first metal layer;

layering a second metal layer, which becomes an upper electrode, on the nitrided upper layer portion of the first metal layer;

forming, from above the second metal layer, a first resist pattern for forming the lower electrode and a wiring pattern, at a region which covers a portion which becomes the upper electrode;

etching the second metal layer and the first metal layer in accordance with the first resist pattern;

forming, on the second metal layer, a second resist pattern for forming the upper electrode; and forming the upper electrode by etching the second metal layer in accordance with the second resist pattern.

20. The method of claim 19, wherein said first metal layer includes Al—Cu film and said second metal layer includes TiN film.

* * * * *